United States Patent [19]
Peng et al.

[11] Patent Number: 5,959,909
[45] Date of Patent: Sep. 28, 1999

[54] MEMORY CIRCUIT WITH AUTO REDUNDANCY

[75] Inventors: Y. T. Peng; J. J. Tsaur, both of Hsinchu, Taiwan

[73] Assignee: Holtek Semiconductor Inc.

[21] Appl. No.: 09/110,831

[22] Filed: Jul. 6, 1998

[30] Foreign Application Priority Data

Oct. 28, 1997 [TW] Taiwan .................................. 86218184

[51] Int. Cl.⁶ ....................................................... G11C 7/00
[52] U.S. Cl. .................. 365/200; 365/185.09; 365/225.7
[58] Field of Search ................... 365/200, 225.7, 365/185.09, 230.03, 189.05, 230.08

[56] References Cited

U.S. PATENT DOCUMENTS

| | | | |
|---|---|---|---|
| 5,359,560 | 10/1994 | Suh et al. ................................ | 365/200 |
| 5,528,540 | 6/1996 | Shibata et al. .......................... | 365/200 |
| 5,657,280 | 8/1997 | Shin et al. .............................. | 365/200 |
| 5,659,510 | 8/1997 | Kwon et al. ............................ | 365/200 |
| 5,798,974 | 8/1998 | Yamagata ................................ | 365/200 |

*Primary Examiner*—Son T. Dinh

[57] ABSTRACT

A memory circuit with auto redundancy, offers the user to repair the defective memory by auto redundancy. The present invention implicates a counter to count the times of the programming verify loop. The user can set the times of the programming verify loop less then the prior art's. When the setting times of the programming verify loop are achieved, the memory cells enable the redundancy cells automatically. Moreover, this invention can use the EPROM, EEPROM and Flash Cells to be the fuse directly to store the address data. So this invention will be more convenience for user to repair the defective memory, and reduce the recording process efficiently.

11 Claims, 5 Drawing Sheets

MEMORY CIRCUIT WITH AUTO REDUNDANCY

BACKGROUND OF THE INVENTION

1. Field of the Invention

This invention relates to a memory circuit with auto redundancy, and more particularly to a circuit which includes the redundant memory cells to replace the defective memory cells in the user application situation.

2. Background of the Invention

It is desired for semiconductor memory chips to improve the "Yield". In general, the manufacturers use an additional redundant memory cells in the chips to improve the yield. The redundant memory cells are used to replace the defective cells prior to packaging. The redundancy technique is always used in the EPROM writer extensively. But this method is only for semiconductor manufacturers to repair the defective cells, it is not for the customer to use when the memory is invalid.

For understanding the conventional redundancy technique more detailed, we take a flow chart to describe the conventional redundancy shown as FIG. 1. In FIG. 1, at first, to set the address signal at the first location 201 after the program begins 200. Then, it sets programming mode and perform program writing (that is, program pulse 500uS) 203. Further, it judges the address signal is the last signal or not 204? If no, the address signal add 1 205 and back to perform program writing 203. If yes, the address signal points the first location 206, then the number of times will be N=0 207. The N means the times of verify program, and it can be set by the user. In this case, the N is set as 25. After setting the N=0, verify the writing data is failed or passed 208. If the data is fail(not correct), then set N=N+1 209. Furthermore, it judge the N=25 210? If N=25, then the device is failed 212. If N≠25, it will be continued to perform program writing 211, and verify the data is failed or passed 208. On the other hand, if the result from the verify data is passed (after 208), then judge the address signal is the last signal or not 213. If not, the address signal will be add 1 214 and back to the set N=0 207. If the address signal is the last signal, then set the program in reading mode 215. Further, compare all data are failed or passed 216. If passed, the program is end 217. If failed, the all data in the program are failed and mean the device is failed 212.

In the conventional memory redundancy, there almost use the fuses as the redundancy cells. For example, the Poly-fuse and Metal-fuse are used as the redundancy material. It is a defect that the fuse (Poly-fuse, Metal-fuse) can only record one time. Furthermore, when the fuse be recorded, there always need another operation procedure. It can not use the electrically programmable read-only memories (EPROM_cell), electrically erasable programmable read-only memories (EEPROM_cell), and the flash memory (Flash_cell) either. So the prior art is not convenient for user, especially about that the customer can not repair the defective memory cells in the prior art.

Thus, there still remains a need for a memory circuit with auto redundancy which overcomes the drawback of the conventional memory redundancy, and the memory circuit provides a convenient method for user to repair the defective memory cells automatically, and it can use the general memory cells to act the fuse cell.

SUMMARY OF THE INVENTION

For obviating the afore-mentioned problem and drawback found in the conventional, it is the primary object of the present invention to provide a memory circuit with auto redundancy, and the present invention can provide the user to repair the defective memory by auto redundancy. Moreover, the present invention implicates a counter to count the times of the programming verify loop. The user can set the times of the programming verify loop less then the prior art's. When the setting times of the programming verify loop are achieved, the memory cells enable the redundancy cells automatically. It will be more convenience for user to repair the defective memory by the present invention.

It is another object of the present invention to provide a good "Yield" memory for mass production.

It is another object of the present invention to provide an elastic application memory which can not only use the electrically programmable read-only memories (EPROM_cell), electrically erasable programmable read-only memories (EEPROM_cell), but also the flash memory (Flash_cell) to be the fuse cells.

In order to accomplish the objects of the present invention, including an input stage circuit used to output a redundancy programing signal. The input stage circuit is coupled to a fuse circuit to output a match signal, and coupled to a power reset circuit to accept a power reset signal. There is also a fuse port generator connected between the power reset circuit and the fuse circuit in the present invention. The fuse port generator receives the redundancy programming signal, then outputs a fuse scan signal to the fuse circuit. Further, the present invention also includes a buffer coupled to an address signal and the match signal. The present invention includes a redundancy decoder coupled to the buffer and the address signal, and a redundancy memory cell coupled to the redundancy decoder. The redundancy decoder receives a redundancy enable signal from the buffer to start the redundancy memory cell to repair the invalid memory cell.

Because this invention is related to a memory circuit, there is a memory unit in the present invention. Furthermore, the memory unit likes the prior art, including a row-decoder, a column-decoder, a memory cell core, a column-select circuit, a programming & sense amplifier circuit, a control circuit, an output buffer and an input buffer.

In order that the present invention may more readily be understood, the following description is given, merely be the way of example, reference being made to the accompanying drawings, wherein:

DETAILED DESCRIPTION OF THE PREFERRED EMBODIMENT

The present invention relates to a memory circuit with auto redundancy, which can provide the customer to repair the defective memory cell. Further, it can use the normal memory cell, for example the EPROM, the EEPROM and the flash memory to be the fuse cell. Importantly, it can provide a good yield for mass production. So this invention overcomes the drawback of the prior art efficiently.

Figure 1:
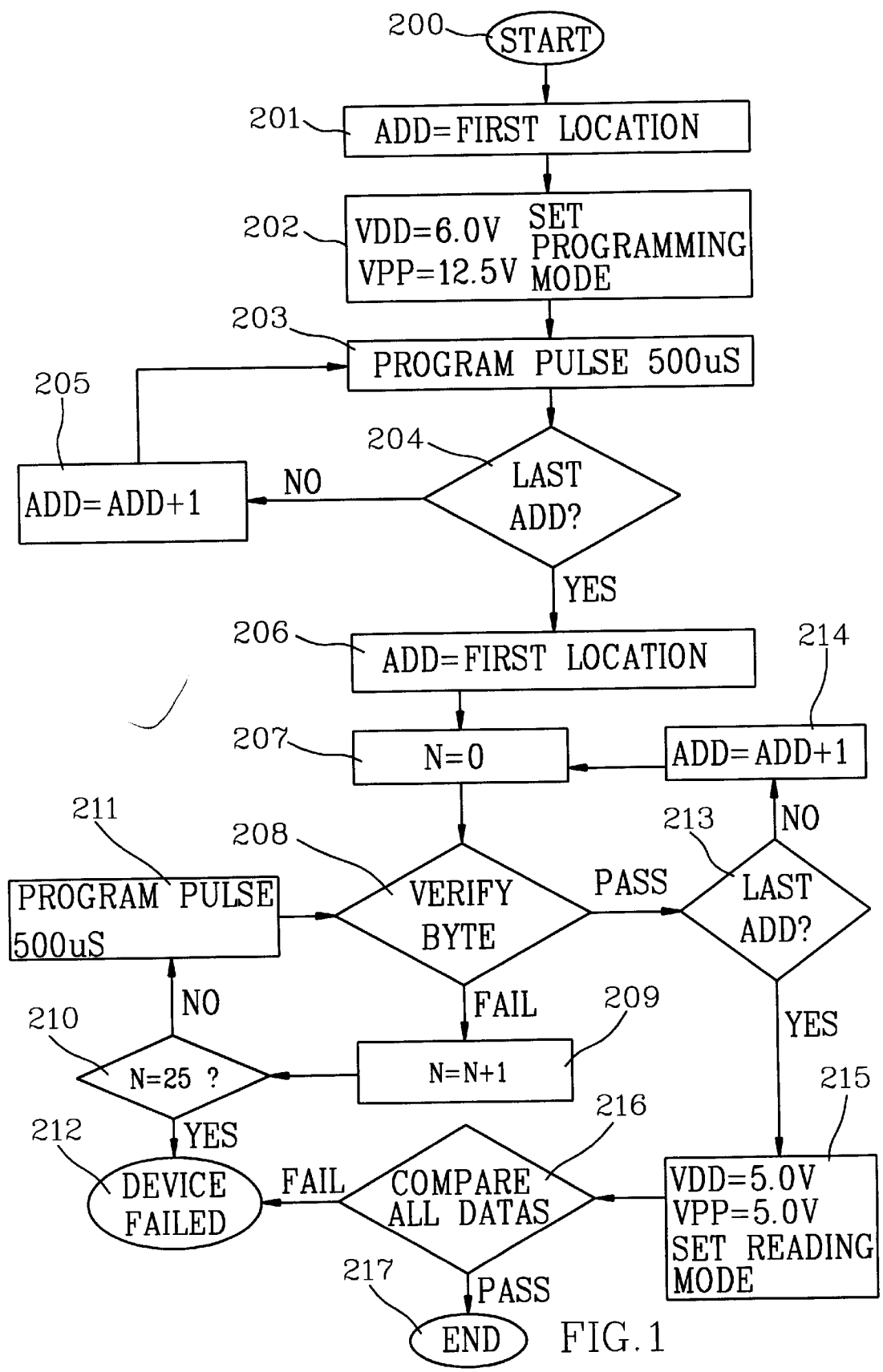
FIG. 1 is flow chart of conventional memory redundancy.
Figure 2:
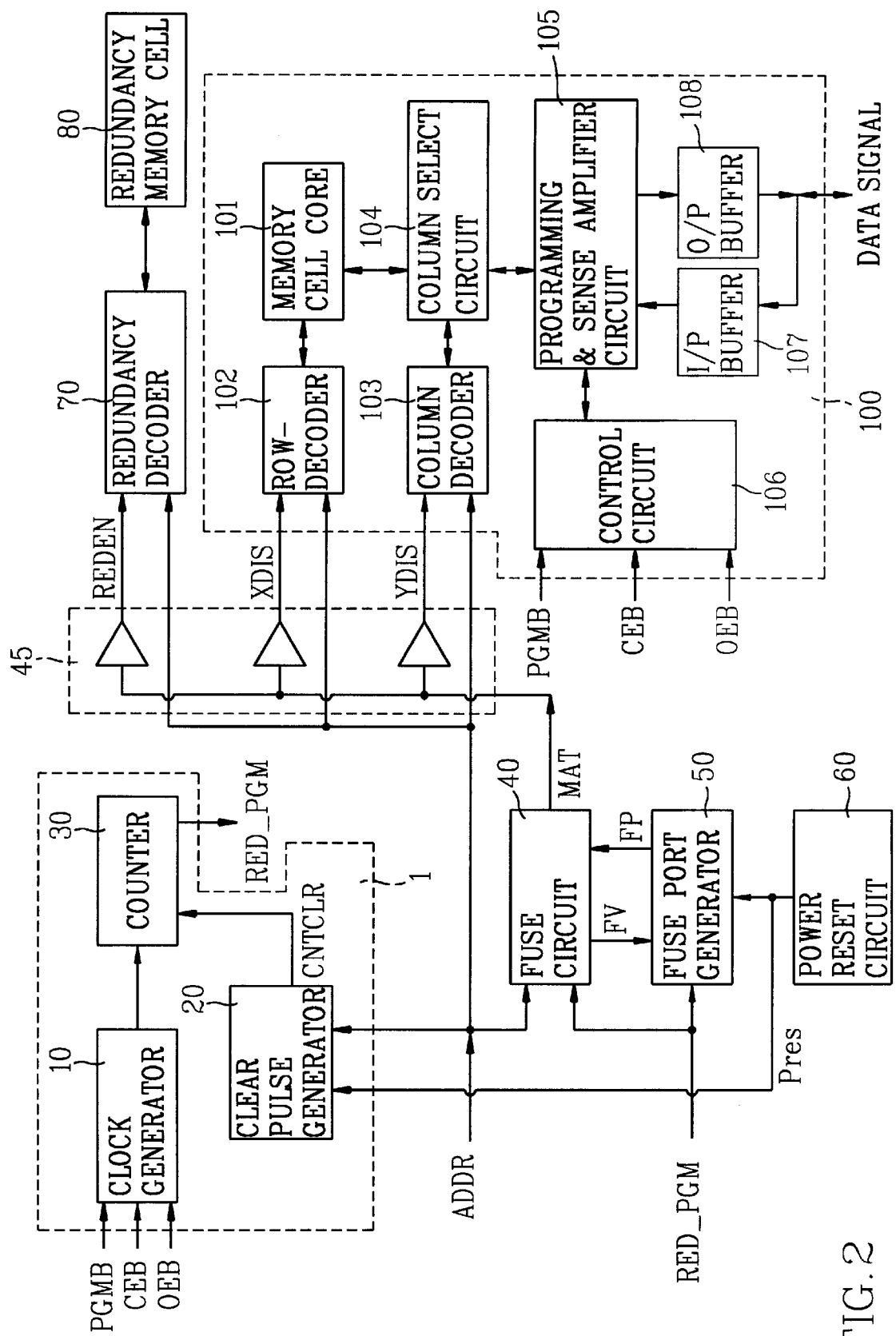
FIG. 2 is a schematic block diagram in accordance with the embodiment of present invention.

Referring to FIG. 2, is a schematic block diagram in accordance with the present invention. It shows the present invention including an input stage circuit 1 which is mainly for receiving a programming enable signal (PGMB), a chip enable signal (CEB), an output enable signal (OEB), an address signal (ADDR) and a power reset signal (Pres), then outputting a redundancy programming signal (RED_PGM). The input stage circuit 1 further includes a clock generator 10, a clear pulse generator 20 and a counter 30. The clock generator 10 is mainly for receiving the PGMB, the CEB and the OEB, then outputting a clock signal to the counter 30. The clear pulse generator 20 is coupled to the ADDR and the Pres, it is mainly for producing a control clear signal (CNTCLR) coupled to the counter 30. The CTNCLR is used to clear the counting of the counter 30 if the memory circuit needed. The counter 30 is used to count the times of the program written in the memory circuit. The counter 30 receives the clock signal and the CNTCLR, then outputs the RED_PGM.

The present invention includes a fuse circuit 40, a fuse port generator 50 and a power reset circuit 60. The fuse circuit 40 is mainly for receiving the ADDR, the RED_PGM and a fuse scan signal (FP) which is from the fuse port generator 50, then output a match signal (MAT) and a fuse verify signal (FV). The fuse port generator 50 is used for receiving the RED_PGM, the Pres and the FV, then outputting the FP to the fuse circuit 40. The power reset circuit 60 is used to output the Pres which can be reset by the user setting.

The ADDR and the MAT are coupled to a buffer 45 which consists of plural comparator. The buffer 45 is mainly for producing a redundancy enable signal (REDEN), a row disenable signal (XDIS) and a column disenable signal (YDIS). The REDEN is coupled to a redundancy decoder 70, and the redundancy decoder 70 is further coupled to a set of redundancy memory cell 80. The redundancy decoder 70 is mainly for decoding the ADDR signal when the REDEN signal is in high level. It also enables the set of redundancy memory cell 80 to replace the defective memory cell.

The XDIS and the YDIS signals are coupled to a memory unit 100. The memory unit 100 likes the prior art, including a row-decoder 102 and a column-decoder 103. The row-decoder 102 and the column-decoder 103 are further couple to a memory cell core 101 and a column-select circuit 104 individually, the column-select circuit 104 is also coupled to the memory cell core 101. The XDIS and the YDIS signals are just coupled to the row-decoder 102 and the column-decoder 103 individually. They are mainly to disenable the executive decoding of the row-decoder 102 and the column-decoder 103 when the redundancy memory cell 80 is enabled, and to forbid the data written into the memory cell core 101.

In the memory unit 100, also includes a programming & sense amplifier circuit 105, a control circuit 106, an input buffer 107 and an output buffer 108. The control circuit 106 is used to receive the PGMB, the CEB and the OEB, then output a control signal coupled to the programming & sense amplifier circuit 105. The input buffer 107 receives the data signal (DAT), then outputs the data to the programming & sense amplifier circuit 105. On the contrary, the output buffer 108 receives the data from the programming & sense amplifier circuit 105, then outputs the data signal (DAT). The programming & sense amplifier circuit 105 is mainly for receiving the command of the control signal to program and amplify the data needed.

Figure 3:
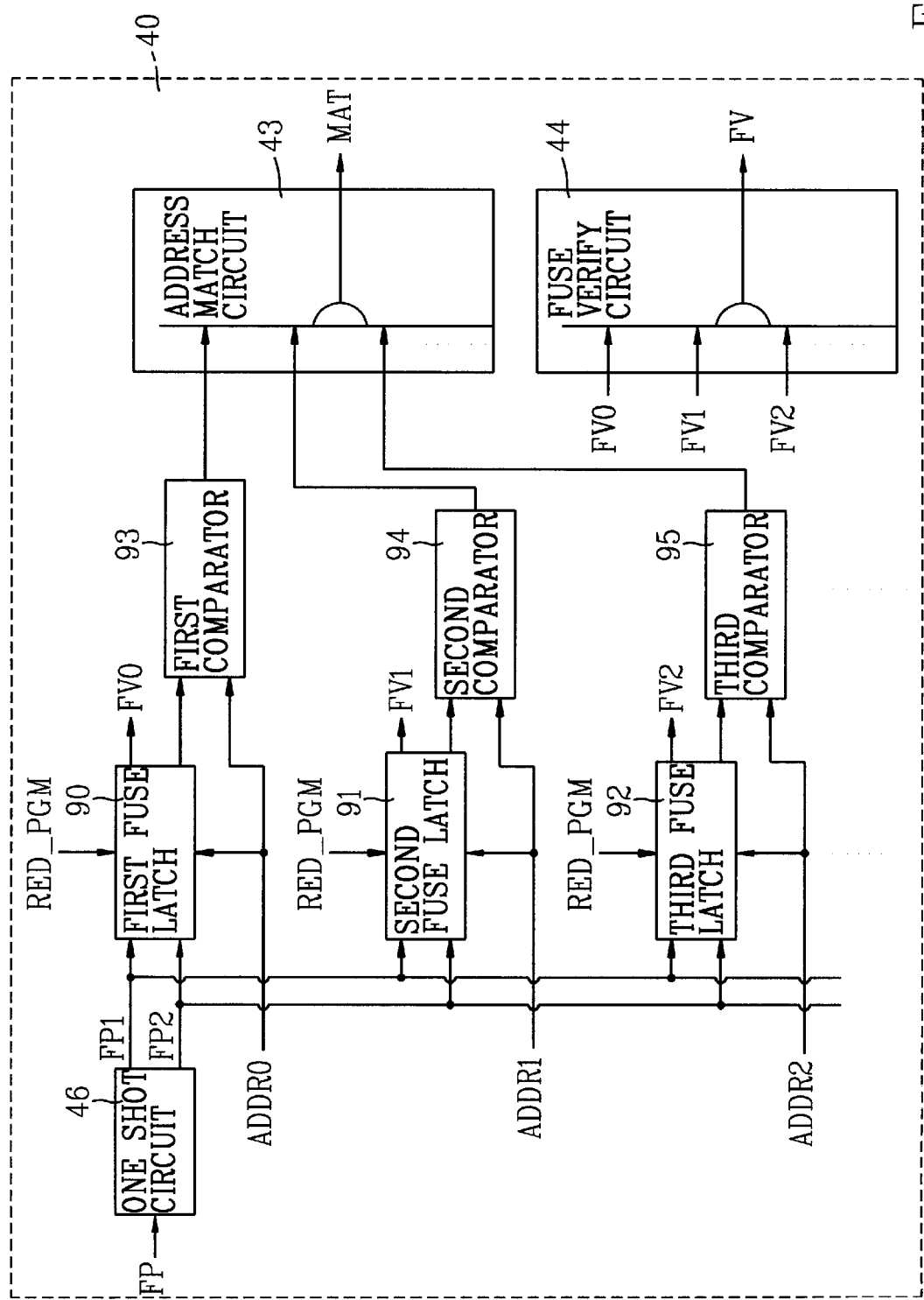
FIG. 3 is a schematic block diagram of the fuse circuit in accordance with the embodiment of the present invention.

Referring to FIG. 3, is shown the further description of the fuse circuit 40 in accordance with the embodiment of the present invention. The fuse circuit 40 includes an one shot circuit 46 which receives the FP from the fuse port generator 50 to output a first fuse scan signal FP1 and a second fuse scan signal FP2. There also includes plural fuse latch circuits, they are the first fuse latch 90, the second fuse latch 91, the third fuse latch 92, etc. In the embodiment of this invention, only showing three fuse latches, it can be expanded to use more than three fuse latches as user needed. The first fuse latch 90 receives the RED_PGM, the ADDR0, the FP1 and the FP2, then it outputs the fuse verify signal FV0 and a reference signal (not symbolic in FIG. 3). The reference signal is coupled to a first comparator 93 to compare with the ADDR0 signal. The comparator 93 is mainly for comparing whether the address signal recorded into the fuse is the same as the original address signal. If the two address signals are the same, the comparator 93 will output a high level signal to an address match circuit 43.

In the same way, the second fuse latch 91 receives the RED_PGM, the ADDR1, the FP1 and the FP2, then it outputs the fuse verify signal FV1 and a reference signal (not symbolic in FIG. 3). The ADDR1 and the reference signal are also coupled to a second comparator 94. The output of the second comparator 94 is coupled to the address match circuit 43 to check whether the address signal recorded into the fuse is the same as the original address signal or not. On the other hand, the third fuse latch 92 receives the RED_PGM, the ADDR2, the FP1 and the FP2, then it outputs the fuse verify signal FV2 and a reference signal. The ADDR2 and the reference signal are further coupled to a third comparator 95. The output of the third comparator 95 is also coupled to the address match circuit 43.

The address match circuit 43 is mainly for receiving the signals from the comparators 93, 94, 95 to output a match signal (MAT). It outputs a high level signal when all the signals from the comparators 93, 94, 95 be high. The MAT is high, means that the all addresses recorded in fuse are same as the original signals. There is also a fuse verify circuit 44 in the fuse circuit 40. The fuse verify circuit 44 is mainly for receiving the FV0, FV1 and FV2 then to output the FV. The FV is high means that the address signals recorded into the fuse are correct, and all the fuses verify are correct. So the fuse circuit 40 is completed as the description above.

Figure 4:
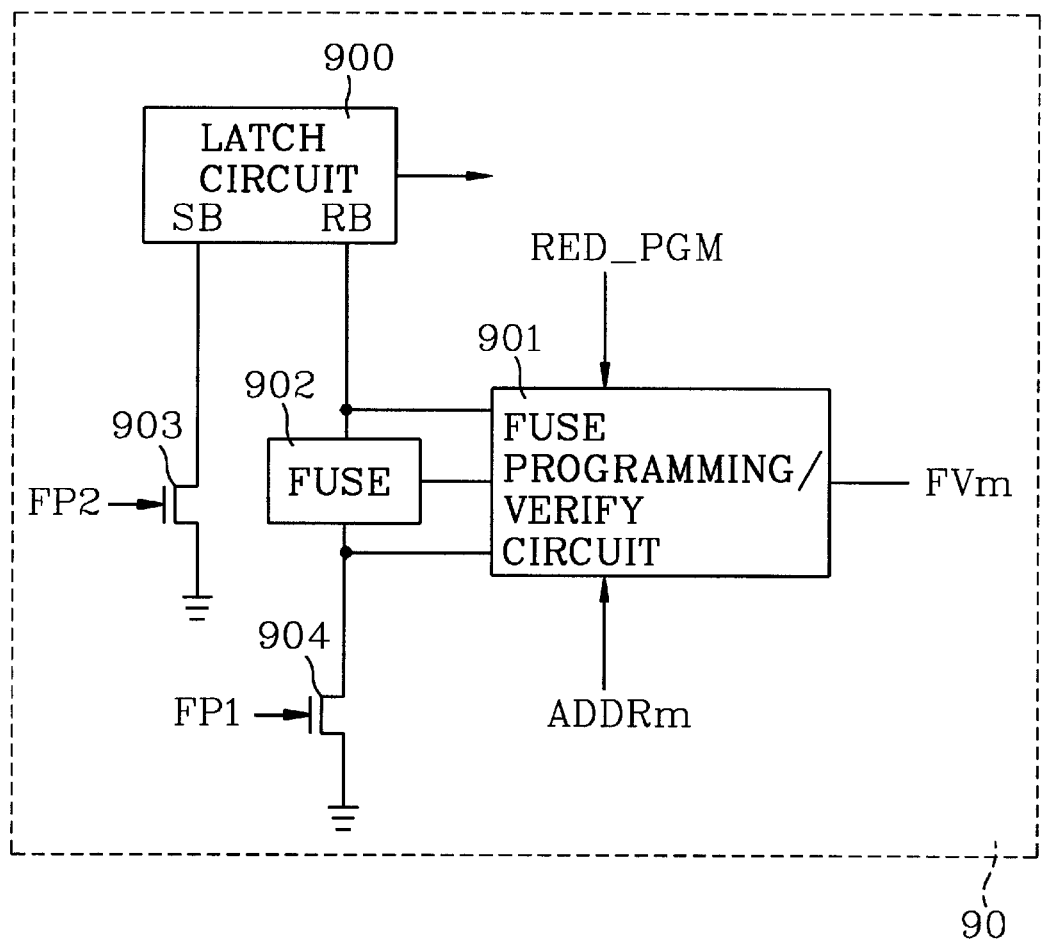
FIG. 4 is a schematic block diagram of the fuse latch in accordance with the embodiment of the present invention.

Referring to FIG. 4, it shows the further description of the fuse latch 90 in accordance with the embodiment of the present invention. The fuse latch 90 includes a latch circuit 900 which is coupled to a transistor 903 and a fuse 902. The transistor 903 couples to the set enable (SB) of the fuse circuit 900 to set the reference signal, and the fuse 902 couples to the reset enable (RB) to reset the reference signal. The fuse 902 is further coupled to a transistor 904. The transistors 903, 904 are controlled by the FP2, FP1 individually.

The fuse 902 are parallel coupled to a fuse programming/verify circuit 901. The fuse programming/verify circuit 901 is receiving the RED_PGM and the ADDRm to record the defective memory cell into the fuse 102. Further, it verifies the recorded address signal is correct or not. If the recorded address signal is correct, the FVm signal will be the high signal outputted. So the first fuse latch 90 is completed as the description above. In the same connection, the circuit diagrams of the second fuse latch 91 and the third fuse latch 92 are same as the first fuse latch 90. It will not to be described any more here.

Figure 5:
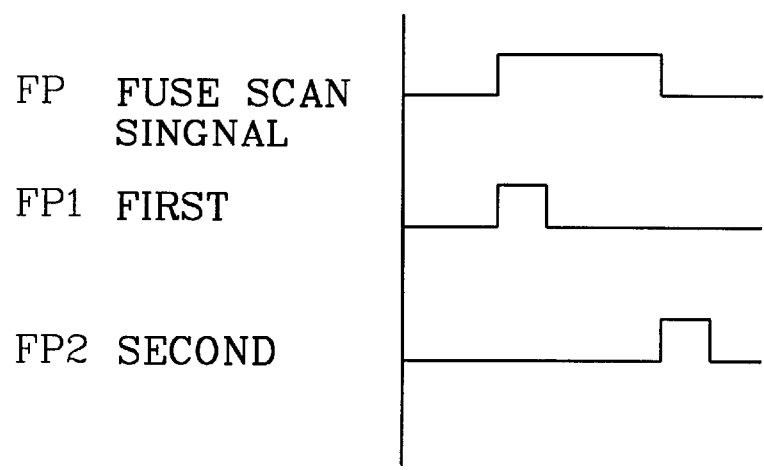
FIG. 5 is a timing illustration showing the fuse scan signal procedure in accordance with the embodiment of the present invention.

Referring to FIG. 5, is a timing illustration showing the fuse scan signal FP procedure in accordance with the embodiment of the present invention. It includes the first fuse scan signal FP1 and second fuse scan signal FP2. The FP1 and FP2 are used to decide the latch circuit 900 is reset or set state. The FP1 is enable when the FP is from low to high. On the contrary, the FP2 is enable when the FP is high to low. So the FP1 and FP2 are not activated in the same time.

Figure 6:
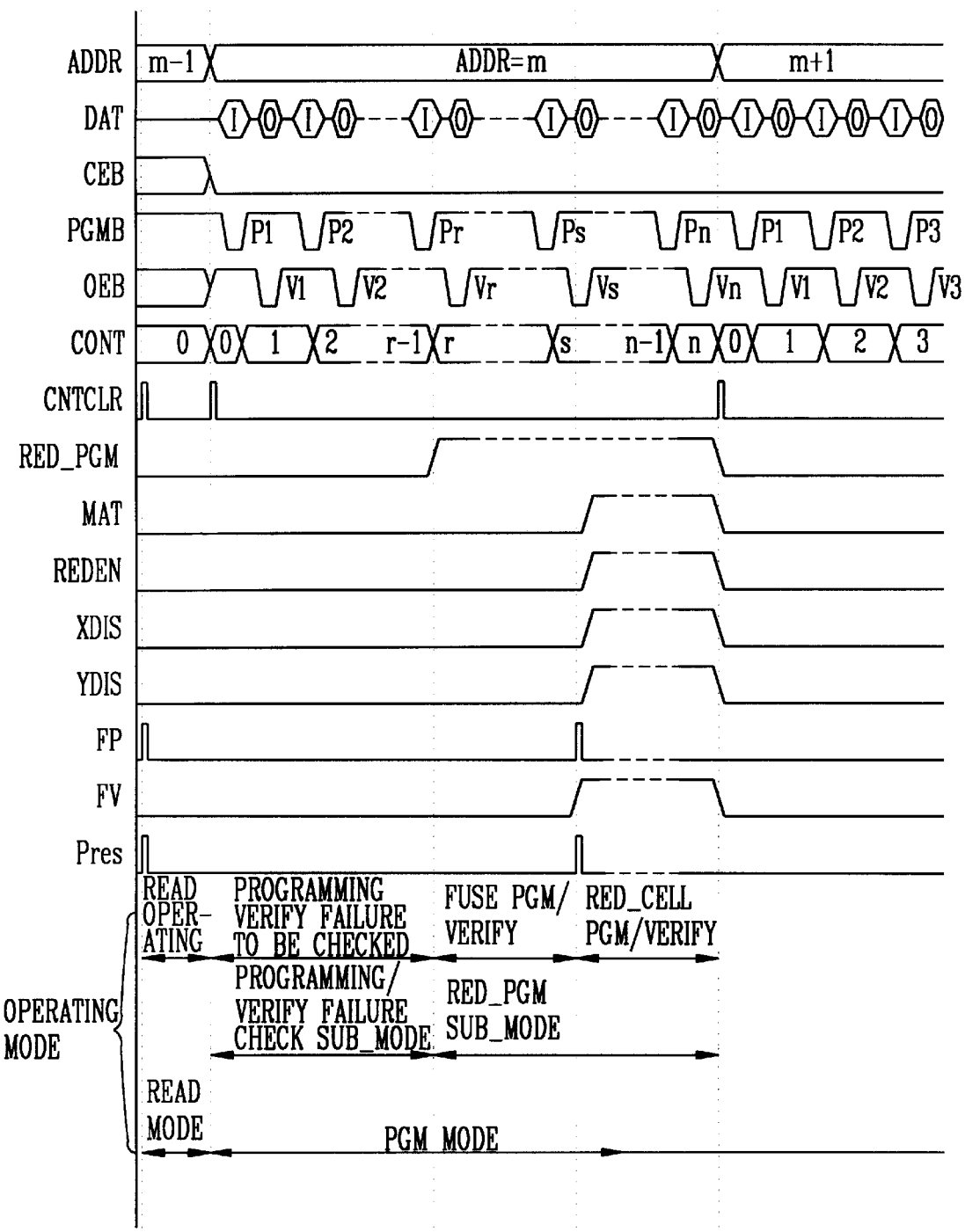
FIG. 6 is a timing illustration showing the whole signal procedure of the embodiment of the present invention.

The timing procedure of all signals are shown in FIG. 6. First of all, the ADDR is the address signal, especially about the address of the memory data. The DAT is the data signal memorized in or out the memory unit 100. The CEB is the chip enable signal, which means the memory circuit whether be selected to operate or not. The PGMB is the programming enable signal, which is used to represent the program be written in or not. The OEB is the output enable signal. The CONT is a counting signal, which is used as the times of the program written in the memory circuit. When the CEB is low, the OEB is high and the PGMB changed from low to high, the CONT counts one time. The CNTCLR is the control clear signal. When the power is reset or the ADDR is changed, the clear pulse generator 20 outputs the CNTCLR pulse signal to clear the CONT to be 0. The RED_PGM is the redundancy programming signal, which is used as an enable signal to start the memory redundancy operation. In this invention, the user can set the CONT is the r-th time to enable the memory redundancy operation. In the prior art, there always set r=25, but we can set the r=8 in this invention. So this invention can be used in user field, further increase the yield.

In this invention, When the CONT counts to the r-th time, the RED_PGM is from low to high, the memory circuit is into the redundancy programming sub-mode (RED_PGM SUB_MODE) operation. The RED_PGM SUB_MODE operation means the address of the defective memory cell will be recorded into the fuse circuit 40, which represents the defective memory will be repaired. Further, the fuse circuit 40 will verify the recording is correct or not. If the verifying result is correct, the FVm will be high. The two signals FP1 and FP2 can turn on the transistor 903 and 904 to make the latch circuit 900 in set or reset situation, then the latch circuit 900 outputs a signal represented the set or reset situation of the latch circuit 900. On the other hand, when the CONT is from 0 to r-th times, the memory circuit is in programming verify failure check sub-mode. The programming verify failure check sub-mode means the memory circuit checks the writing program is failure or not.

Furthermore, the RED_PGM SUB_MODE is divided into the fuse programming/verify mode (FUSE PGM/VERIFY) and the redundancy cell programming/verify mode (RED_CELL PGM/VERIFY). The FUSE PGM/VERIFY means the program written into the fuse and verify the writing programming is correct or not. The RED_CELL PGM/VERIFY means the program written into the redundancy memory cell 80 and verify the program is correct or not. The Pres comes from the power reset circuit 60, which is used as a power reset signal to announce the clear pulse generator 20 outputted the CNTCLR to clear the counter 30.

After of all, before the user into the next READ MODE, the memory circuit must operate in the program mode (PGM MODE) firstly. So the program will be recorded into the memory cell core 101 in advance, and it is the common truth. In the present invention, we just utilize the program mode period to detect the memory cell core 101 is damaged or not, and further repairing the damaged memory cell core.

While this invention has been described in connection with what is presently considered to be the most practical and preferred embodiment, it is to be understood that the invention is not limited to the disclosed embodiments, but on the contrary, it is intended to cover various modifications and equivalent arrangements included within the spirit and scope of the appended claims.

I claim:

1. A memory circuit with auto redundancy, which can provide an auto redundancy operation to repair the defective memory, comprising:

an input stage circuit receiving a programming enable signal, a chip enable signal, an output enable signal, an address signal and a power reset signal, then output a redundancy programming signal, for starting the redundancy operation;

a fuse circuit coupled to the input stage circuit to record an address data of the defective memory cell core by a fuse, and comparing the address data with original data then output a match signal;

a fuse port generator coupled to the input stage circuit and the fuse circuit for receiving the redundancy programming signal and a fuse verify signal then outputting a fuse scan signal;

a buffer coupled to the fuse circuit, receiving the match signal and the address signal, outputting a redundancy enable signal, a row disenable signal and a column disenable signal;

a redundancy decoder receiving the redundancy enable signal and the address signal to decode the address data;

a set of redundancy memory cell coupled to the redundancy decoder to memorize the defected memory cell which need to be repaired;

a memory unit receiving the programming enable signal, the chip enable signal and the output enable signal, coupling with the buffer, then outputting or inputting a data signal, to memorize the input/output data.

2. The memory circuit with auto redundancy of claim 1, wherein the input stage circuit including:

a clock generator receiving the programming enable signal, the chip enable signal and the output enable signal, then outputting a clock signal coupled to a counter for counting;

a clear pulse generator receiving the address signal and the power reset signal, then outputting a control clear signal to clear counting;

a counter coupled to the clock generator and the clear pulse generator, receiving the clock signal and the control clear signal, then outputting a redundancy programming signal to enable the redundancy function.

3. The memory circuit with auto redundancy of claim 1, wherein the fuse circuit including:

an one shot circuit receiving the fuse scan signal from the fuse port generator, outputting a first scan signal and a second scan signal;

a set of fuse latches coupled to the one shot circuit, further receiving the address signal and the redundancy programming signal, then outputting a fuse verify signal and a reference signal to latch the preset address signal;

a set of comparators coupled to the fuse latches and the address signals to compare the present address signals with the preset address signals, that they are the same or not;

an address match circuit coupled to the comparators to check whether the present address signals are same as the preset address signal or not;

a fuse verify circuit coupled to the fuse latches, receiving the fuse verify signals to check the present address signals are correct or not.

4. The memory circuit with auto redundancy of claim 3, wherein the fuse latch including:

a latch circuit having first input coupled to a fuse and a first transistor to be a reset enable controlling line, second input coupled to a second transistor to be a set enable controlling line;

a first transistor coupled to the latch circuit to reset the latch circuit by a first fuse scan signal;

a second transistor coupled to the latch circuit to set the latch circuit by a second fuse scan signal a fuse connected between the latch circuit and the first transistor to memorize the address signals;

a fuse programming/verify circuit coupled to the fuse, further receiving the redundancy programming signal and the address signal, then outputting a fuse verify signal.

5. The memory circuit with auto redundancy of claim 3, wherein the fuse latches consists of first fuse latch, second fuse latch, etc, according with the need of user.

6. The memory circuit with auto redundancy of claim 3, wherein the comparators consists of first comparator, second comparator, etc, according with the need of user.

7. The memory circuit with auto redundancy of claim 4, wherein the fuse can be a poly-fuse to save the address signal for comparison.

8. The memory circuit with auto redundancy of claim 4, wherein the fuse can be a metal-fuse to save the address signal for comparison.

9. The memory circuit with auto redundancy of claim 4, wherein the fuse can be an EPROM_Cell to save the address signal for comparison.

10. The memory circuit with auto redundancy of claim 4, wherein the fuse can be an EEPROM_Cell to save the address signal for comparison.

11. The memory circuit with auto redundancy of claim 4, wherein the fuse can be a Flash_Cell to save the address signal for comparison.

* * * * *